US006808748B2

(12) United States Patent
Kapoor et al.

(10) Patent No.: US 6,808,748 B2
(45) Date of Patent: Oct. 26, 2004

(54) HYDROGEN ASSISTED HDP-CVD DEPOSITION PROCESS FOR AGGRESSIVE GAP-FILL TECHNOLOGY

(75) Inventors: Bikram Kapoor, Santa Clara, CA (US); M. Ziaul Karim, San Jose, CA (US); Anchuan Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/350,445

(22) Filed: Jan. 23, 2003

(65) Prior Publication Data

US 2004/0146661 A1 Jul. 29, 2004

(51) Int. Cl.$^7$ ............................................. C23C 16/40
(52) U.S. Cl. ............................ 427/255.31; 427/255.37; 427/255.38; 427/575; 438/695
(58) Field of Search ....................... 427/255.31, 255.37, 427/255.38, 575; 438/695

(56) References Cited

U.S. PATENT DOCUMENTS

| | | |
|---|---|---|
| 4,690,746 A | 9/1987 | McInerney et al. |
| 4,737,379 A | 4/1988 | Hudgens et al. |
| 4,835,005 A | 5/1989 | Hirooka et al. |
| 4,890,575 A | 1/1990 | Ito et al. |
| 5,645,645 A | 7/1997 | Zhang et al. |
| 5,712,185 A | 1/1998 | Tsai et al. |
| 5,719,085 A | 2/1998 | Moon et al. |
| 5,804,259 A | 9/1998 | Robles |
| 5,872,058 A | 2/1999 | Van Cleemput et al. |
| 5,903,106 A * | 5/1999 | Young et al. ............ 315/111.41 |
| 5,910,342 A | 6/1999 | Hirooka et al. |
| 5,976,327 A | 11/1999 | Tanaka |
| 5,990,013 A | 11/1999 | Berenguer et al. |
| 6,013,191 A | 1/2000 | Nasser-Faili et al. |
| 6,013,584 A | 1/2000 | M'Saad |
| 6,030,881 A | 2/2000 | Papasouliotis et al. |
| 6,039,851 A | 3/2000 | Iyer |
| 6,106,678 A * | 8/2000 | Shufflebotham et al. .............. 204/192.32 |
| 6,194,038 B1 | 2/2001 | Rossman |
| 6,217,658 B1 | 4/2001 | Orczyk et al. |
| 6,228,751 B1 | 5/2001 | Yamazaki et al. |
| 6,313,010 B1 | 11/2001 | Nag et al. |

(List continued on next page.)

FOREIGN PATENT DOCUMENTS

| | | |
|---|---|---|
| GB | 2 267 291 A | 12/1993 |
| JP | 2-58836 A | 2/1990 |
| JP | 7-161703 A | 6/1995 |

OTHER PUBLICATIONS

Meeks et al., "Modeling of $SiO_2$ deposition in high density plasma reactors and comparisons of model predictions with experimental measuerments," *J. Vac. Sci. Technol. A*, 16(2):544–563 (1998).

(List continued on next page.)

*Primary Examiner*—Timothy Meeks
(74) *Attorney, Agent, or Firm*—Townsend and Townsend & Crew

(57) ABSTRACT

A method of depositing a silicon oxide layer over a substrate having a trench formed between adjacent raised surfaces. In one embodiment the silicon oxide layer is formed in a multistep process that includes depositing a first portion of layer over the substrate and within the trench by forming a high density plasma process that has simultaneous deposition and sputtering components from a first process gas comprising a silicon source, an oxygen source and helium and/or molecular hydrogen with high D/S ratio, for example, 10–20 and, thereafter, depositing a second portion of the silicon oxide layer over the substrate and within the trench by forming a high density plasma process that has simultaneous deposition and sputtering components from a second process gas comprising a silicon source, an oxygen source and molecular hydrogen with a lower D/S ratio of, for example, 3–10.

21 Claims, 5 Drawing Sheets

U.S. PATENT DOCUMENTS 6,335,288 B1 * 1/2002 Kwan et al. ................ 438/694
6,395,150 B1    5/2002 Van Cleemput et al.
6,596,653 B2 * 7/2003 Tan et al. .................... 438/788
6,596,654 B1 * 7/2003 Bayman et al. ............. 438/788
6,653,203 B1 * 11/2003 Huang et al. ............... 438/435

OTHER PUBLICATIONS

Nalwa, H.S., *Handbook of Low and High Dielectric Constant Materials and Their Applications*, vol. 1, p. 66 (1999).

Nguyen, s.v., "High–Density Plasma Chemical Vapor Deposition of Silicon–Based Dielectric Films for Integrated Circuits," *Journal of Research and Development*, vol. 43, 1/2 (1999).

Vassiliev et al., "Trends in Void–Free Pre–Metal CVD Dielectrics," *Solid State Technology*, pp. 129–136 (Mar. 2001).

* cited by examiner

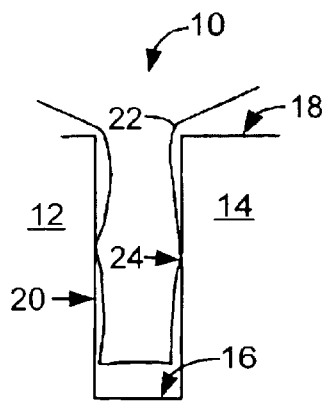
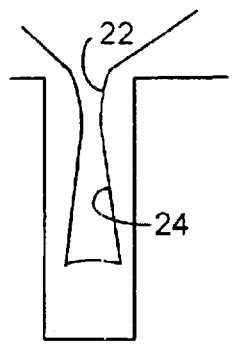
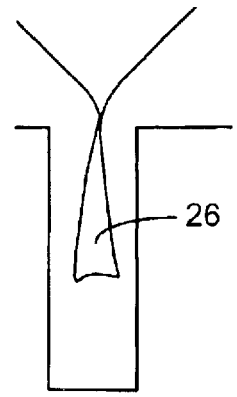
FIG. 1A   FIG. 1B   FIG. 1C
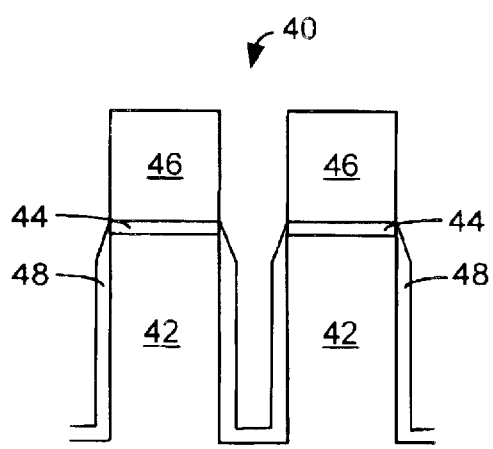
FIG. 2
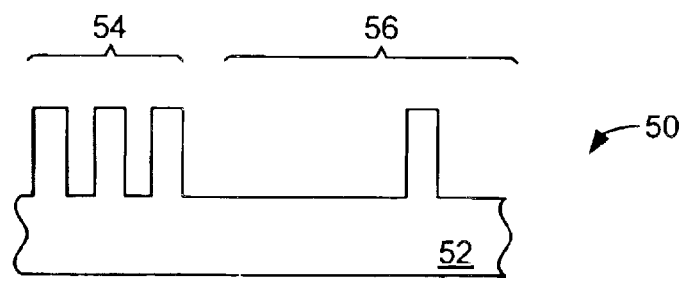
FIG. 3

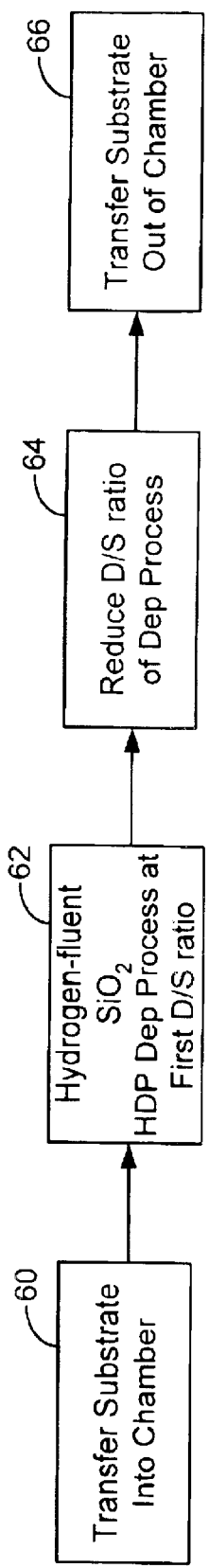
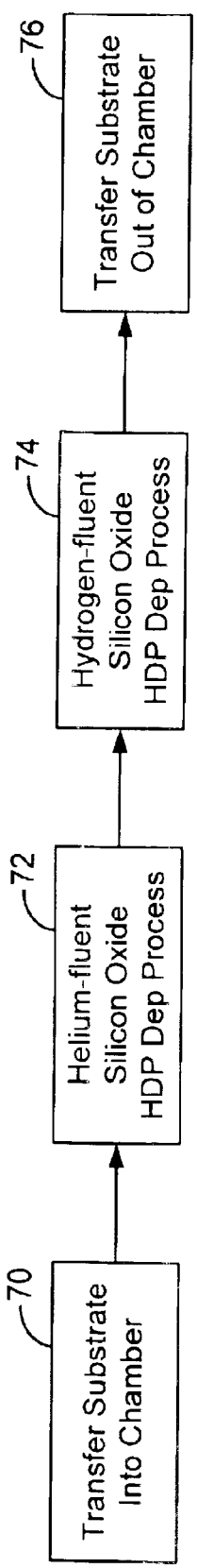
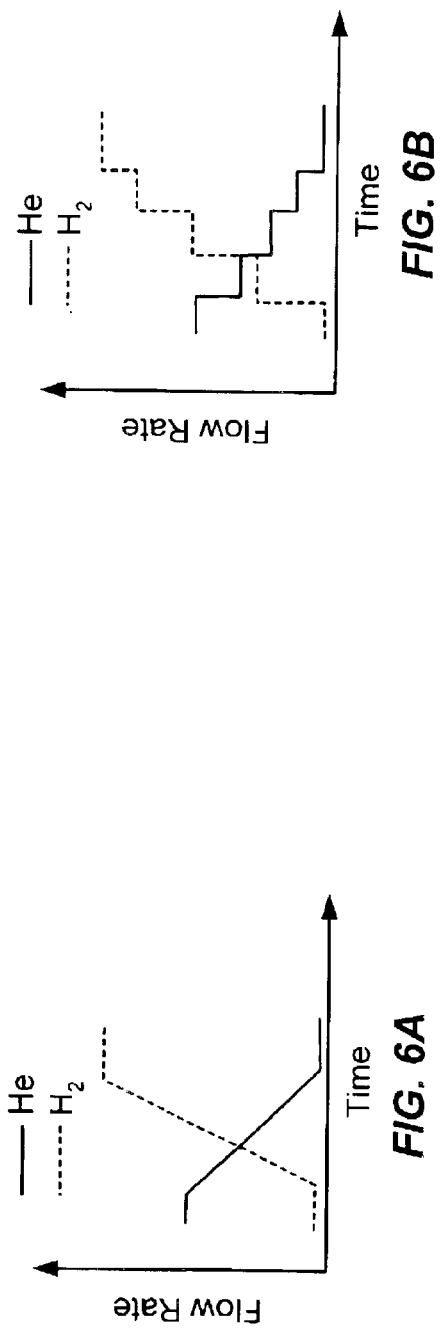

US 6,808,748 B2

HYDROGEN ASSISTED HDP-CVD DEPOSITION PROCESS FOR AGGRESSIVE GAP-FILL TECHNOLOGY

BACKGROUND OF THE INVENTION

The present invention relates to the manufacture of integrated circuits. More specifically, the invention relates to an improved method of depositing silicon oxide layers for use as a dielectric material in such integrated circuits.

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or a plasma-enhanced chemical vapor deposition (PECVD) processes. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film.

Semiconductor device geometries have dramatically decreased in size since such devices were first introduced several decades ago. The dramatic reduction in device geometry has, in turn, dramatically increased the density of circuit elements and interconnections formed in integrated circuits fabricated on semiconductor substrates. One persistent challenge faced by semiconductor manufacturers in the design and fabrication of such densely packed integrated circuits is the desire to prevent spurious interactions between circuit elements.

Unwanted interactions are typically prevented by providing spaces (sometimes referred to herein as a "gap" or "trench") between adjacent elements that are filled with an electrically insulative material to isolate the elements both physically and electrically. As circuit densities increase with smaller feature sizes, the widths of these spaces decrease, increasing their aspect ratio. The aspect ratio of a gap is defined by the ratio of the gap's height or depth to its width. High aspect ratio gaps are difficult to fill using conventional CVD methods. A films' ability to completely fill such gaps is referred to as the film's "gap-filling" ability. Silicon oxide based films (also referred to as "silica glass" based films) are one family of insulation films that is commonly used fill the gaps in intermetal dielectric (IMD) applications, premetal dielectric (PMD) applications and shallow trench isolation (STI) applications among others. A silicon oxide film used in such an application is often referred to as a gap-fill film or a gap-fill layer.

Some integrated circuit manufacturers have turned to the use of high density plasma CVD (HDP-CVD) systems to deposit silicon oxide gap-fill layers. HDP-CVD systems form a plasma that is approximately two orders of magnitude or greater than the density of a standard, capacitively-coupled plasma CVD system. Examples of HDP-CVD systems include inductively coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system.

Another factor that allows films deposited by HDP-CVD techniques to have improved gap-fill characteristics as compared to films deposited by other CVD techniques is the occurrence of sputtering, promoted by the plasmas' high density, simultaneous with film deposition. The sputtering element of HDP deposition slows deposition on certain features, such as the corners of raised surfaces, thereby contributing to the increased gap-fill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to further promote sputtering and provide better gap-fill characteristics for a given film.

It was initially thought that because of their simultaneous dep/etch nature, HDP-CVD processes could fill the gaps or trenches that were created in almost any application. Semiconductor manufacturers have found out, however, that there is a practical limit to the aspect ratio of gaps that HDP-CVD films are able to fill. For example, one HDP-CVD process commonly used to deposit a silicon oxide gap-fill film forms a plasma from a process gas that includes silane ($SiH_4$), molecular oxygen ($O_2$) and argon (Ar). It has been reported that when such a process is used to fill certain narrow-width, high aspect ratio gaps, the sputtering caused by argon in the process gas may hamper the gap-fill efforts. Specifically, it has been reported that material sputtered by argon in the process redeposits on the upper portions of the sidewalls of the gaps being filled at a rate faster than at the lower portions. This in turn, may result in the formation of a void in the gap if the upper areas of regrowth join before the gap is completely filled.

FIGS. 1A–1C, which are simplified cross-sectional views of a silicon oxide film at different stages of deposition, illustrate the potential gap-fill limitation that is associated with some HDP-CVD processes that are required to fill certain small width gaps having relatively high aspect ratios. The gap-fill problem illustrated in FIGS. 1A–1C is somewhat exaggerated in order to better illustrate the problem.

FIG. 1A shows the initial stages of film deposition over a substrate (not shown) having a gap 10 defined by two adjacent features 12, 14 formed over the substrate. As shown in FIG. 1A, the conventional HDP-CVD silicon oxide deposition process results in direct silicon oxide deposition on horizontal surface 16 within gap 10 and horizontal surfaces 18 above features 12, 14. The process also results in indirect deposition (referred to as re-deposition) of silicon oxide on sidewalls 20 due to the recombination of material sputtered from the silicon oxide film as it grows In certain small-width, high-aspect-ratio applications, the continued growth of the silicon oxide film results in formations 22 on the upper section gap sidewall that grow toward each other at a rate of growth exceeding the rate at which the film grows laterally on lower portions 24 of the sidewall (see FIG. 1B also). The final result of this process is that a void 36 forms as shown in FIG. 1C.

A variety of techniques have been developed to extend the gap-fill capabilities of silica glass HDP-CVD processes. Two specific examples include, U.S. Pat. No. 5,872,058 and U.S. Pat. No. 6,395,150, each of which is assigned to Novellus. The '058 patent discloses that the gap-fill capabilities of a silica glass film can be extended by reducing the amount of argon or other inert components in the HDP oxide process. Specifically, the '058 patent teaches that in order to fill higher aspect ratio gaps, it is important to limit the amount of inert components in the process gas to no more than 13 percent of the total gas mixture.

The '150 patent discloses that if argon, which is a diluent gas in addition to a sputtering agent, is eliminated from the process gas as suggested in the '058 patent, deposition rate uniformity may suffer. The '150 patent teaches this problem may be addressed by adding a flow of helium to the process gas. The '150 patent teaches that the amount of helium added should be between 15–90 percent of the total gas mixture and lists between 10–2000 sccm as an exemplary flow rate range. The '150 patent also lists hydrogen as an example of a diluent that can be used instead of helium. The '150 patent does not disclose specific details about what gaseous sources may be used to supply the hydrogen or how much hydrogen should be added.

BRIEF SUMMARY OF THE INVENTION

Embodiments of the present invention pertain to methods of depositing silicon oxide films using HDP-CVD deposition techniques. These embodiments enable improved gal-fill capabilities as compared to some other known HDP-CVD silicon oxide deposition techniques and are particularly useful for the manufacture of integrated circuits having minimum feature sizes of 0.10 microns or less.

According to one embodiment of the invention, a silicon oxide layer is formed over a substrate having a trench formed between adjacent raised surfaces in a multi-step process that includes depositing a first portion of layer over the substrate and within the trench by forming a high density plasma process that has simultaneous deposition and sputtering components from a first process gas comprising, a silicon source, an oxygen source and molecular hydrogen with higher D/S ratio of 10–20, and thereafter, depositing a second portion of the silicon oxide layer over the substrate and within the trench by forming a high density plasma process that has simultaneous deposition and sputtering components from a second process gas comprising a silicon source, an oxygen source and molecular hydrogen with lower D/S ratio of 3–10. In one specific embodiment, the first portion of the silicon oxide layer reduces the height of the trench by 30–65 percent and the second portion of the oxide layer completes the filing of the trench.

According to another embodiment of the invention, a silicon oxide layer is formed over a substrate having a trench formed between adjacent raised surfaces in a multi-step process that includes depositing a first portion of layer over the substrate and within the trench by forming a high density plasma process that has simultaneous deposition and sputtering components from a first process gas comprising a silicon source, an oxygen source and helium and, thereafter, depositing a second portion of the silicon oxide layer over the substrate and within the trench by forming a high density plasma process that has simultaneous deposition and sputtering components from a second process gas comprising a silicon source, an oxygen source and molecular hydrogen. In one specific embodiment, the first portion of the silicon oxide layer reduces the height of the trench by 10–50 percent and the second portion of the oxide layer completes the filling of the trench.

According to still another embodiment of the invention, a method of depositing a silicon oxide film on a substrate having a trench formed between adjacent raised surfaces includes flowing a process gas comprising a silicon source, an oxygen source, helium and molecular hydrogen into the chamber and decreasing over time a ratio of a flow rate of helium to molecular hydrogen. The method also includes forming a plasma having an ion density of at least $1 \times 10^{11}$ ions/cm$^3$ from the process gas to deposit the said silicon oxide layer over the substrate using a process that has simultaneous deposition and sputtering components. In one specific embodiment, the process gas includes only $SiH_4$, $O_2$ and helium during an initial stage of the deposition process; includes only $SiH_4$, $O_2$, helium and molecular hydrogen during a subsequent stage of deposition process; and includes only $SiH_4$, $O_2$ and molecular hydrogen during a final stage of the deposition process.

Embodiments of the invention can also be used in high density plasma deposition/etch/deposition (dep/etch/dep) silicon oxide gap-fill processes.

These and other embodiments of the present invention, as well as its advantages and features are described in more detail in conjunction with the text below and attached figures.

BRIEF DESCRIPTION OF THE DRAWINGS

FIGS. 1A–1C are simplified cross-sectional views of a silicon oxide film at different stages of deposition within a narrow width, high aspect ratio gap according to a prior art silicon oxide deposition process;

FIG. 2 is a simplified cross sectional view of a trench in a shallow trench isolation structure for which embodiments of the invention can be used to fill;

FIG. 3 is a simplified cross-section view of a partially completed integrated circuit having trenches to be filled with a dielectric material in both a densely packed area and an open area;

FIGS. 4 and 5 are flow charts depicting the steps associated with embodiments of the present invention;

FIGS. 6A and 6B are graphs depicting exemplary, relative flow rates of helium and hydrogen according to two different embodiments of the invention derived from the embodiment of FIG. 5B;

DETAILED DESCRIPTION OF THE INVENTION

Figure 7A:
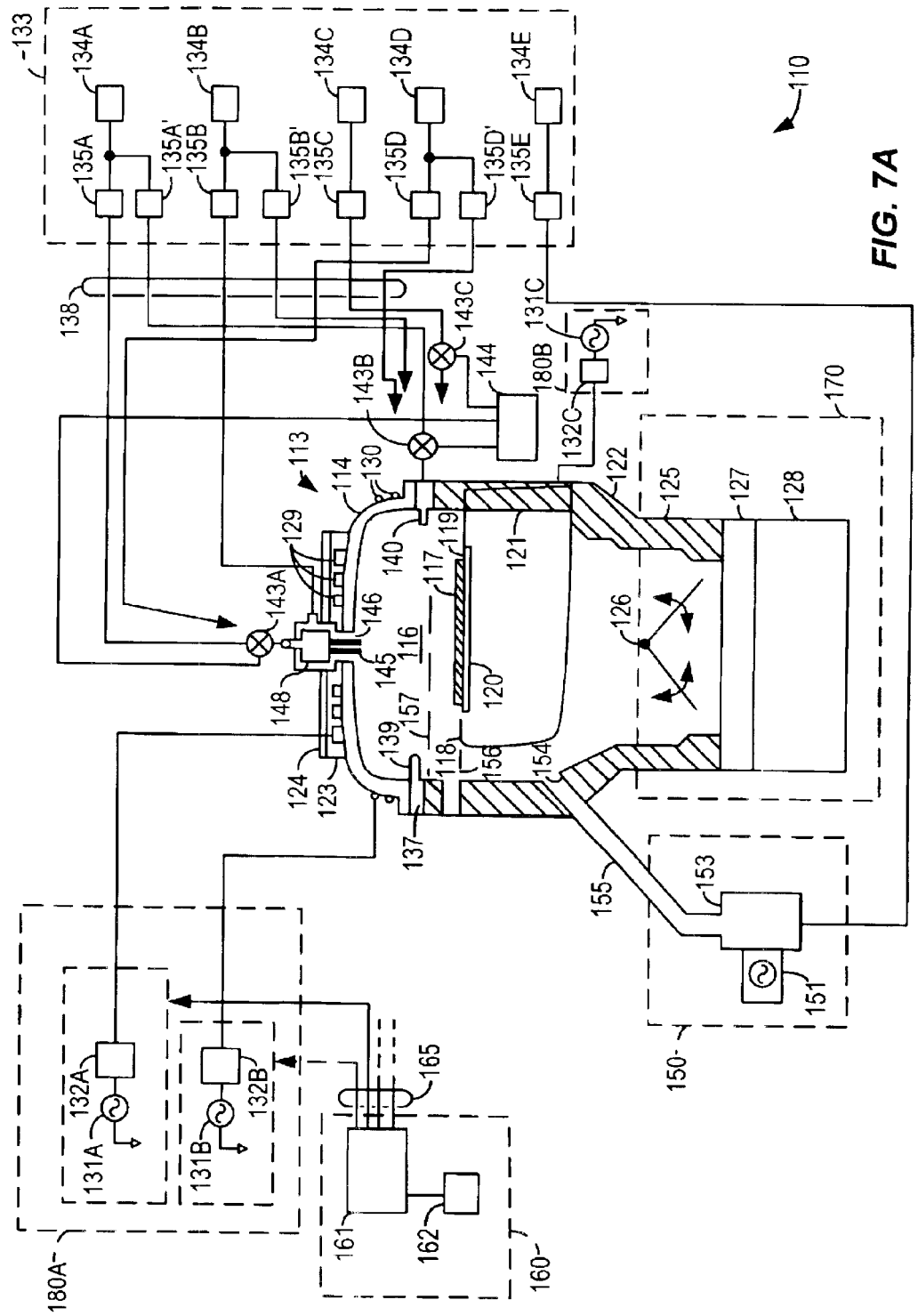
FIG. 7A is a simplified, cross-sectional view of an exemplary substrate processing system with which embodiments of the present invention may be used.

Embodiments of the invention are directed towards a method of depositing a silica glass layer to fill a gap in a surface of a substrate using a high density plasma CVD process. Silica glass films deposited according to the techniques of the invention have excellent gap-fill capabilities and are able to fill high aspect ratio gaps encountered in, for example, silicon trench isolation structures. Films deposited by the method of the invention are suitable for use in the fabrication of a variety of integrated circuits, and are particularly useful in the fabrication of integrated circuits having minimum feature sizes of 0.13 microns or less.

As used herein, a high density plasma process is a plasma CVD process that includes simultaneous deposition and sputtering components and that employs a plasma having an ion density on the order of $1 \times 10^{11}$ ions/cm$^3$ or greater. The relative levels of the combined deposition and sputtering characteristics of the high-density plasma may depend on factors such as the flow rates of various gases included in the gaseous mixture from which the plasma is formed as well as the source and bias power levels applied to maintain the plasma and bias the plasma towards the substrate, respectively. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter rate increases with increased deposition and decreases with increased sputtering, As used in the definition of D/S, the "net deposition rate" refers to the deposition rate that is measured when deposition and sputtering are occurring simultaneously. The "blanket sputter rate" is the sputter rate measured when the process recipe is run without deposition gases, the pressure within the process chamber is adjusted to the pressure during deposition and the sputter rate measured on a blanket thermal oxide.

As is known to those of skill in the art, other equivalent measures may be used to quantify the relative deposition and sputtering contributions of a HDP process. For example, a common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of EID, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of one or more precursor gases and a fluent gas, which may also act as a sputtering agent. The elements comprised by the precursor gases react to form the film with the desired composition. For example, to deposit a silicon oxide film, the precursor gases may include a silicon containing gas, such as monosilane $SiH_4$, and an oxygen-containing gas, such as $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, a flow of Ne, a flow of Ar, a flow of Xe, a flow of Kr, or a flow of Rn. The level of sputtering provided by the different fluent gases is generally inversely related to their atomic mass (or molecular mass in the case of $H_2$), with $H_2$ producing even less sputtering than He.

In order to obtain optimal gap-fill characteristics in an HDP silicon oxide deposition process, the inventors have determined that the sputtering component of the process has to be decreased as compared to the sputtering component of many previously employed HDP oxide deposition processes. As stated previously, one known method of decreasing the sputtering component of an HDP oxide deposition process is by dramatically reducing (or eliminating) the flow of argon in the process. When argon is eliminated from the process gas, some previously developed processes added a flow of helium or hydrogen in order to compensate for a decrease in deposition rate uniformity seen with the absence of argon.

In order to better appreciate and understand the present invention, reference is made to FIG. 2, which is a simplified cross-sectional view of a substrate having a trench etched therein as part of a shallow trench isolation structure. The processes discussed below are for an undoped silica glass (USG) film that may be used, for example, in a shallow trench isolation (STI) application. It is to be understood, however, that the techniques of the present invention are applicable to other applications such as intermetal dielectric (IMD) layers and premetal dielectric (PMD) among others. Also, the techniques of the present invention are applicable to the deposition of a variety of materials using HDP-CVD techniques. These materials, the use of which is application dependent, include phosphorous silica glass (PSG), boron-doped silicate glass (BSG) and borophosphosilicate glass (BPSG).

The substrate has one or more gaps formed between adjacent raised features such as trench 40 shown in FIG. 2. The raised features may be, for example, dielectric hardmasks, adjacent metal lines, transistor gates or other features. In FIG. 2, however, the raised features represent areas of a silicon substrate 42 between trenches etched in the substrate. The STI structure shown in FIG. 2 also includes silicon nitride portions 46 above the raised features and a silicon oxide interface or pad oxide 44 between the silicon nitride portions 46 and silicon substrate 42. Also shown in FIG. 3 is an oxide or nitride liner layer 48, such as an in situ steam generation (ISSG) oxide or other thermal oxide layer, or LPCVD or PECVD silicon nitride. In some applications trench 40 has an aspect ratio of between about 4:1 to 6:1 and the formation of a highly conformal film such as oxide or nitride liner 48 in trench 40 may increase the aspect ratio even further.

As shown in FIG. 3, integrated circuits, such as IC 50, typically have areas 54 of densely packed active devices (e.g., the area where transistors are formed) formed on a substrate 52 and relatively isolated areas 56 (also referred to as an "open area") where active devices may be separated from each other by a distance an order of magnitude or more than the spacing between devices in the densely packed active area. The inventors have found that sidewall redeposition occurs at a significantly higher rate on gaps/trenches formed in the densely packed portion of an integrated circuit than on gaps/trenches formed in the open areas. Thus, in some instances D/S sputter ratios of a $SiH_4$, $O_2$, $H_2$ process that effectively fill a given trench in densely packed area 54 of substrate 52 without undesirably clipping the corner of the trench will result in clipping problems in isolated area 56 because not enough material is deposited on the sidewalls of the trenches formed in the isolated region.

To address this issue, some embodiments of the invention deposit a silicon oxide film in a multi-step deposition process as shown in the flowcharts of FIGS. 4 and 5. One such embodiment, shown in FIG. 5A, starts, for example, by transferring a substrate into the substrate processing chamber (step 60) and then depositing a first portion of the gap-fill layer by using a high density plasma having a silicon source, such as $SiH_4$, and oxygen source, such as $O_2$ and molecular $H_2$ as the fluent gas at a relatively high D/S ratio of, for example, 10–20 (step 62). Some embodiments add a small amount of argon (e.g., less than or equal to about 1%) to the process gas in order to improve deposition rate uniformity and to achieve optimal gap-fill capabilities. Next, a second portion of the silicon oxide gap-fill layer is deposited using a high density plasma that used the same gap chemistries at a lower D/S ratio of, for example, 3–10 (step 64). After deposition of the second portion of the layer is complete, the substrate can be transferred out of the chamber in preparation for subsequent processing (step 66).

Another embodiment of the invention deposits a silicon oxide film in a multi-step deposition process as shown in the flowchart of FIG. 5. Such a process starts, for example, by transferring a substrate into the substrate processing chamber (step 70) and then depositing a first portion of the gap fill layer by using a high density plasma having a silicon source, such as $SiH_4$, and oxygen source, such as $O_2$ and a first fluent gas (step 72). Next, a second portion of the silicon oxide gap-fill layer is deposited using a high density plasma that replaces the first fluent gas with a second fluent gas that has a lower average molecular mass than the first fluent gas used in step 72 (step 74). After deposition of the second portion of the layer is complete, the substrate can be transferred out of the chamber in preparation for subsequent processing (step 76). In some embodiments the first fluent gas consists of helium. Other embodiments add a small amount of argon (e.g., less than or equal to about 1%) to the first fluent gas in order to improve deposition rate uniformity and reduce the amount of helium required by the process to achieve optimal gap-fill capabilities. In still other embodiments the first fluent gas comprises a mixture of helium and hydrogen with or without a small amount of argon or another inert gas. Similarly, in some embodiments the second fluent gas consists of molecular hydrogen while in other embodiments the second fluent gas comprises a mixture of hydrogen and a relatively small amount of helium (e.g., less than or equal to about 20%) and/or a very small amount of argon (e.g., less than or equal to 1%).

The helium-fluent oxide deposition step in employed in step 62 produces considerably more sputtering than a hydrogen-fluent oxide deposition process and thus provides for more redeposition on the sidewalls of trenches in open areas 56 than does a hydrogen-fluent process. For some applications, the additional amount of sidewall redeposition is sufficient to prevent corner clipping that may otherwise occur during the initial deposition stage of a hydrogen-fluent process. Embodiments of the invention switch from the helium-fluent process to the hydrogen-fluent process because the inventors have found that a hydrogen-fluent process has improved gap-fill capabilities as compared to a helium-fluent process for aggressive narrow-width, high aspect ration applications. In some embodiments, the helium-fluent oxide process is used to reduce the height of the gap by between 10–50 percent (as measured from the bottom of the gap) and the hydrogen-fluent process is then used to fill the remaining 50–90 percent of the gap height.

An example of a suitable silicon oxide HDP deposition process that employs helium as the fluent gas in step 62 is set forth in Table 1 below:

TABLE 1

Exemplary Gas Flows For Helium-fluent USG Process

| Total $SiH_4$ flow | 35–90 sccm |
|---|---|
| Total $O_2$ flow | 45–150 sccm |
| Total He flow | 100–400 sccm |

Further details of suitable helium-fluent silicon oxide HDP deposition processes can be found in U.S. patent application Ser. No. 10/137,132, entitled "Method for High Aspect Ratio HDP CVD Gap-fill," filed Apr. 30, 2002, having Zhong Qiang Hua et al. listed as inventors and is hereby incorporated by reference.

In some embodiments the transition between the various deposition steps, including any change in gas flows, chamber pressure, RF power levels and other parameters, is done while a plasma is maintained in the chamber. In other embodiments, however, the plasma is extinguished between steps, gas flows and other parameters are adjusted in preparation for the next step and a plasma is reformed. Embodiments in which the plasma is extinguished can be performed in situ either within a single chamber or in different chambers of a multi-chamber mainframe system or preformed ex situ in different chambers. In some embodiments, in situ processes are preferred for throughput and performance reasons.

Also in some embodiments the progression from a helium-fluent to hydrogen-fluent oxide gap-fill process is gradual. FIGS. 6A and 6B illustrate two different examples of such embodiments. In FIG. 6A, the flow of helium is gradually reduced during the process from an initial, relatively high rate to a final, relatively low (or zero) rate. Concurrently, the flow of hydrogen is gradually increased during the process from a first relatively low (or zero) rate to a final, relatively high rate. The process depicted in FIG. 6B is similar except that the flow rates of helium and hydrogen are increased and decreased, respectively, in a step-wise manner. A small flow of argon can be continuously added to the process or added during only a portion of the process (e.g., an initial portion) if desired. Based upon the description of the above multiple-step helium-fluent and hydrogen-fluent oxide gap-fill processes, a person of skill in the art will recognize many alternative methods of varying the flows of helium, hydrogen and/or argon to accomplish similar results.

Embodiments of the invention, including the embodiments discussed with respect to FIGS. 2, 4, 6A and 6B can also be used as one or more of the deposition steps in a multistep dep/etch/etch HDP processes.

Exemplary High Density Plasma Chamber

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

FIG. 7A illustrates one embodiment of a high density plasma chemical vapor deposition (HDP-CVD) system 110 in which a gap-fill dielectric layer according to the present invention can be deposited. System 110 includes a chamber 113, a substrate support 118, a gas delivery system 133, a remote plasma cleaning system 150, a vacuum system 170, a source plasma system 180A, a bias plasma system 180B.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 113 includes a body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated below, gas sources 134(a) . . . 134(n) include separate sources for $SiH_4$, $O_2$, $H_2$ and $NF_3$ as well as one or more sources for the extended cleaning process. As would be understood by a person of skill in the art, the actual sources used for sources 134(a) . . . 134(n) and the actual connection of delivery lines 138 to chamber 113 varies depending on the deposition and cleaning processes executed within chamber 113. Gas flow from each source 134(a) . . . 134(n) is controlled by one or more mass flow controllers (not shown) as is known to those of skill in the art.

Figure 7B:
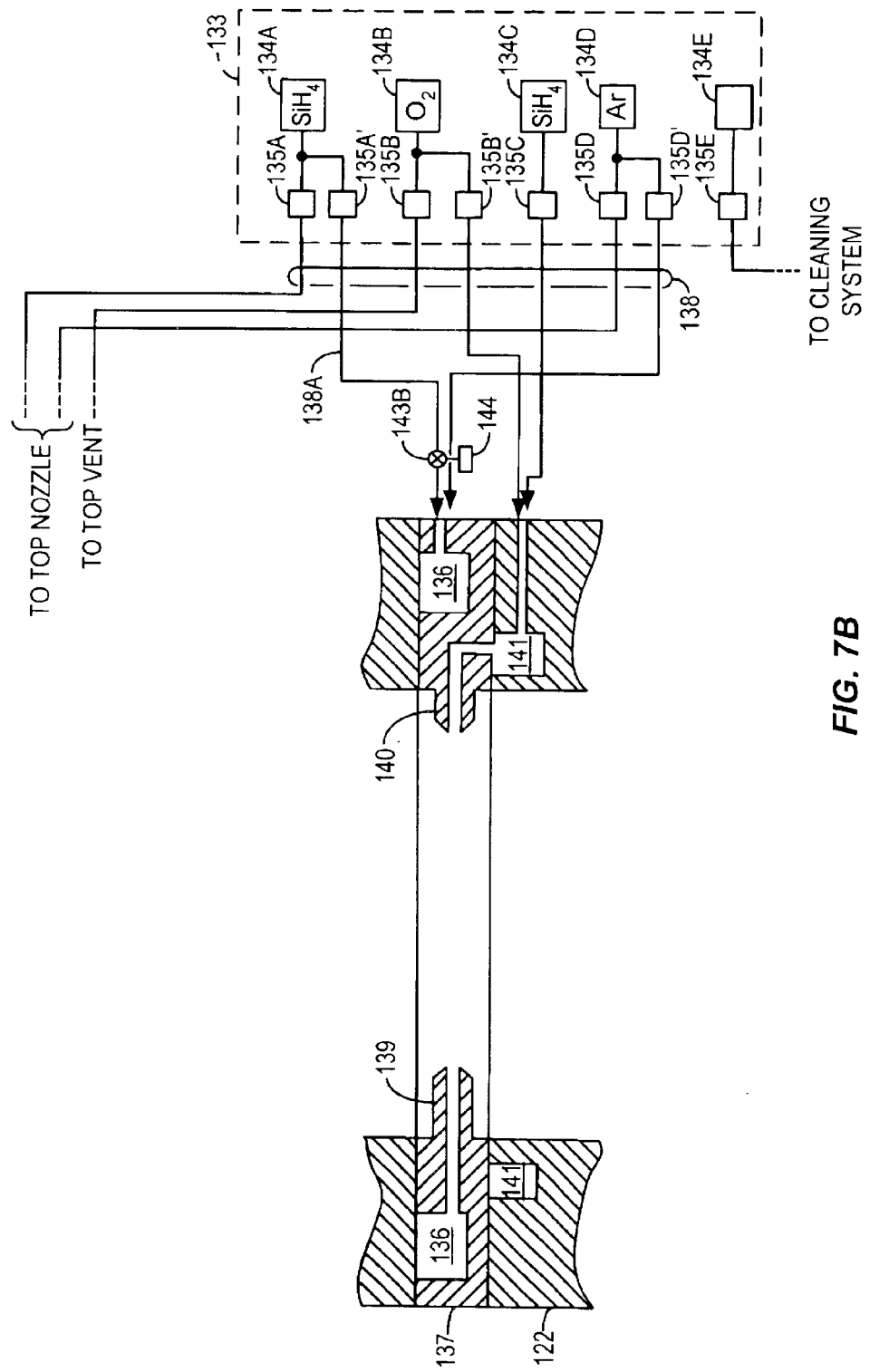
FIG. 7B is a simplified cross-sectional view of a gas ring that may be used in conjunction with the exemplary CVD processing chamber of FIG. 7A.

Gases are introduced into chamber 113 through a gas ring 137 and/or a top nozzle 145. FIG. 7B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 124 gas nozzles 139 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 7A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 7A, chamber 113 also has top nozzle 145 and top vent 146. Top nozzle 145 and top vent 146 allow independent control of top and side flows of the gases, which improves film uniformity and allows fine adjustment of the films' deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system 150, such as a microwave plasma source or torodial plasma source, is provided to periodically clean deposition residues from chamber components in a dry cleaning operation. The cleaning system includes a remote plasma generator 151 that creates a plasma from one or more cleaning gas source in sources 134(a) . . . 134(n) (e.g., molecular fluorine, nitrogen trifluoride, other perfluorocompound or equivalents alone or in combination with another gas such as argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

Table 2 below lists the process parameters according to a multistep helium-fluent followed by hydrogen-fluent HDP silicon oxide deposition process according to one embodiment of the invention implemented in the Ultima HDP-CVD chamber manufactured for Applied Materials and outfitted for 200 mm substrates. The gas flow rates and other parameters set forth in Table 2 (and used in other examples set forth in this application) are optimized for a deposition process run in the Ultima chamber. A person of ordinary skill in the art will recognize that these rates and parameters are in part chamber specific and will vary if chambers of other design and/or volume are employed.

TABLE 2

Exemplary Process Parameters for a Multistep Deposition Process According to One Embodiment of Invention

| Parameter | He-fluent Dep Process (Step 62) | $H_2$-fluent Dep Process (Step 64) |
|---|---|---|
| Top RF Power (1.8 MHz) | 3000–5100 W | 3000–5100 W |
| Side RF Power (2.1 MHz) | 3000–4800 W | 3000–4800 W |
| Bias RF Power (13.56 MHz) | 600–4000 W | 600–4000 W |
| $SiH_4$ Flow | 35–90 sccm | 20–70 sccm |
| $O_2$ Flow | 45–150 sccm | 35–200 sccm |
| He Flow | 100–400 sccm | — |
| $H_2$ Flow | — | 800–1500 sccm |
| Pressure | 1.5–6.0 mTorr | 20–50 mTorr |

In some particular embodiments, the flow of molecular hydrogen is introduced from both nozzles surrounding the periphery of the substrate and at least one nozzle positioned above the substrate pointing downwards towards the substrate surface. The inventors have found that such an arrangement may enable deposition of a film having improved uniformity characteristics as opposed to introducing the molecular hydrogen flow from either one or more nozzles above the substrate or one or more nozzles surrounding the substrate. Also, in some embodiments, $SiH_4$ and $O_2$ are introduced from separate, non-fluidicly coupled nozzles sets, such as nozzles 139 and 140, positioned around the substrate. Additionally, these embodiments may also introduce a flow of silane from a nozzle above the substrate, such as nozzle 141. Having been so described, the optimization of a particular flow rate of a fluent or precursor gas from a side nozzle or top nozzle can readily be determined by a person of skill in the art.

Experimental Results

Figure 8:
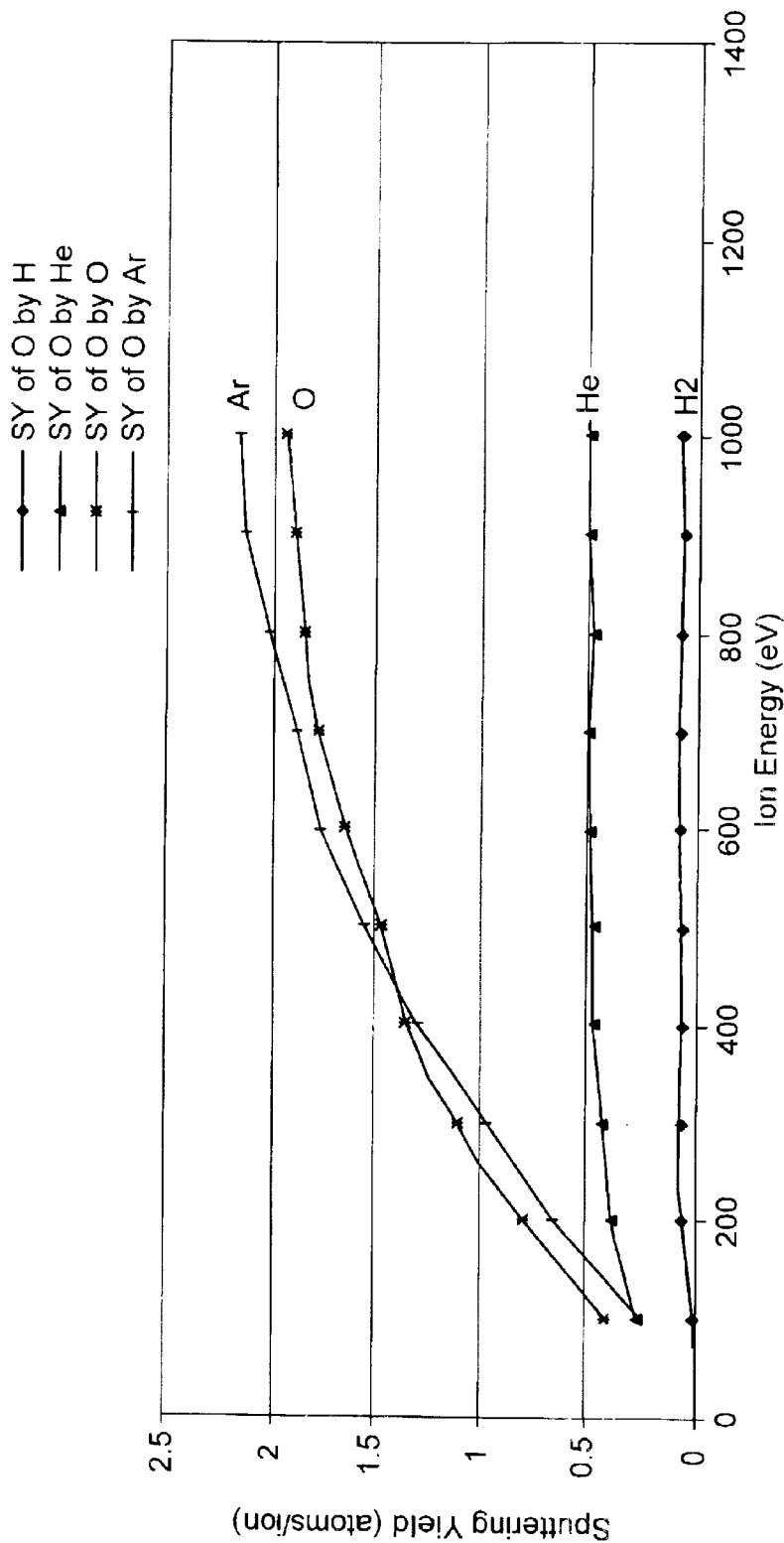
FIG. 8 is a graph depicting the sputtering yield of silicon dioxide for various ion species at an angle of incidence of 45 degrees to the surface at ion energies of between 100–1000 eV.

In order to better appreciate the benefit achievable by the method of the invention reference is now made to FIG. 8, which is a graph depicting the sputtering yield of silicon dioxide for various ion species at an angle of incidence of 45 degrees to the surface at ion energies of between 100–1000 eV. The graph of FIG. 8 was generated using the Stopping and Range of Ions in Matter (SRIM) computer program available for download at http://www.srim.org. As shown in FIG. 8, argon and oxygen are rather effective sputtering agents that generate an increased amount of sputtered material as ion energy is increased. FIG. 8 also shows that (i) helium, while being a less effective sputtering agent than oxygen or argon, still generates about five times as much sputtering as molecular hydrogen and (ii) molecular hydrogen can be added to a silicon oxide gap-fill deposition process without introducing additional sputtering effects as ion energy levels are increased.

Having fully described several embodiments of the present invention, many other equivalents or alternative embodiments of the present invention will be apparent to those skilled in the art. For example, while the invention described with respect to an undoped silicate glass layer, the invention can also be used to improve the gap-fill capabilities of phosphosilicate glass (PSG), boron-doped silicate glass (BSG) and boron phosphosilicate glass (BPGS) layers as well as other types of materials by adding an appropriate dopant gas such as $PH_3$ for PSG or, $B_2H_6$ for BSG in one or more of the film deposition steps. Also, in other embodiments, an oxygen source such as $N_2O$ or $CO_2$ can be used instead of $O_2$ and a silicon source other than monosilane may be used. Examples of suitable silicon sources include other silane family members such as, $Si_2H_6$, $Si_3H_8$, etc.; TEOS or $SiF_4$ among others. The scope of the invention should, therefore, be determined not with reference to the above description, but instead should be determined with reference to the appended claims along with their full scope of equivalents.

What is claimed is:

1. A method of depositing a silica glass film on a substrate disposed in a substrate processing chamber, the substrate having a trench formed between adjacent raised surfaces, the method comprising, in order:

depositing a first portion of the silica glass film over the substrate and within the trench by forming a high density plasma process that has simultaneous deposition and sputtering components from a first process gas comprising a silicon source, an oxygen source and helium, but substantially no molecular hydrogen; and thereafter, depositing a second portion of the silica glass film over the substrate and within the trench by forming a high density plasma process that has simultaneous deposition and sputtering components from a second process gas comprising a silicon source, an oxygen source and molecular hydrogen.

2. The method of claim 1 wherein the silicon source in the first and second process gases comprises monosilane ($SiH_4$).

3. The method of claim 2 wherein the oxygen source in the first and second process gases comprises molecular oxygen ($O_2$).

4. The method of claim 1 wherein the first portion of the silica glass film reduces a height of the trench by between 30–65 percent.

5. The method of claim 4 wherein the second portion of the silica glass film completes the filling of the trench.

6. The method of claim 1 wherein the first process gas consists of SiH4, O2 and helium and the second process gas consists of $SiH_4$, $O_2$ and molecular hydrogen.

7. The method of claim 6 wherein ratio of the flow rate of helium to molecular hydrogen is varied over time in a step-wise manner.

8. A method of depositing a silica glass film on a substrate disposed in a substrate processing chamber, the substrate having a trench formed between adjacent raised surfaces, the method comprising, in order:

depositing a first portion of the silica glass film over the substrate and within the trench by forming a high density plasma process that has simultaneous deposition and sputtering components from a first process gas comprising a silicon source, an oxygen source and molecular hydrogen, wherein the first portion of the silica glass film is deposited at a first D/S ratio; and thereafter, depositing a second portion of the silica glass film over the first portion as deposited and within the trench by forming a high density plasma process that has simultaneous deposition and sputtering components from a second process gas comprising a silicon source, an oxygen source and, wherein the second portion of the silica glass layer is deposited at a second D/S ratio less than the first ratio.

9. The method of claim 8 wherein the silicon source in the first and second process gases comprises monosilane ($SiH_4$).

10. The method of claim 9 wherein the oxygen source in the first and second process gases comprises molecular oxygen ($O_2$).

11. The method of claim 8 wherein the first portion of the silica glass film reduces a height of the trench by between 10–50 percent.

12. The method of claim 11 wherein the second portion of the silica glass film completes the filling of the trench.

13. The method of claim 8 wherein the first process gas consists of $SiH_4$, $O_2$ and hydrogen and the second process gas consists of $SiH_4$, $O_2$ and hydrogen.

14. The method of claim 8 wherein the first D/S ratio is between 10 and 20 and the second D/S ratio is between 3 and 10.

15. A method of depositing a silica glass film on a substrate disposed in a substrate processing chamber, the substrate having a trench formed between adjacent raised surfaces, the method comprising, in order:

depositing a first portion of the silica glass film over the substrate and within the trench by forming a high density plasma process that has simultaneous deposition and sputtering components from a first process gas comprising a silicon source, an oxygen source and a first fluent gas; and thereafter, depositing a second portion of the silica glass film over the substrate and within the trench by forming a high density plasma process that has simultaneous deposition and sputtering components from a second process gas comprising a silicon source, an oxygen source and a second fluent gas, wherein an average molecular mass of the second fluent gas is less than an average molecular mass of the first fluent gas.

16. A method of depositing a silica glass film on a substrate disposed in a substrate processing chamber, the substrate having a trench formed between adjacent raised surfaces, the method comprising:

flowing a process gas comprising a silicon source, an oxygen source, helium and molecular hydrogen into the chamber; and forming a plasma having an ion density of at least $1 \times 10^{11}$ ions/cm$^3$ from said process gas to deposit said silicon oxide layer over said substrate in a process that has simultaneous deposition and sputtering components; wherein during deposition of the silicon oxide layer a ratio of a flow rate of helium to molecular hydrogen is decreased.

17. The method of claim 16 wherein the silicon source comprises monosilane ($SiH_4$).

18. The method of claim 17 wherein the oxygen source comprises molecular oxygen ($O_2$).

19. The method of claim 17 wherein the process gas further comprises argon.

20. The method of claim 17 wherein at an initial stage of deposition of the silicon oxide layer the process gas consists of $SiH_4$, $O_2$ and helium and, during a subsequent stage of deposition of the silicon oxide layer, the process gas consists of $SiH_4$, $O_2$, helium and molecular hydrogen.

21. The method of claim 20 wherein during a final stage of deposition of the silicon oxide layer the process gas consists of $SiH_4$, $O_2$ and molecular hydrogen.

* * * * *